United States Patent [19]

Benhamida

[11] Patent Number: 4,816,777
[45] Date of Patent: Mar. 28, 1989

[54] CONTROLLED OSCILLATOR

[75] Inventor: Boubekeur Benhamida, Hennepin, Minn.

[73] Assignee: Honeywell Inc., Minneapolis, Minn.

[21] Appl. No.: 190,732

[22] Filed: May 5, 1988

[51] Int. Cl.⁴ .............................................. H03K 3/027
[52] U.S. Cl. ...................................... 331/57; 331/172
[58] Field of Search ........... 331/55, 57, 108 A, 108 C, 331/172; 365/189, 191, 193, 233

[56] References Cited

U.S. PATENT DOCUMENTS 4,686,489  8/1987  Caspell .................................. 331/57

Primary Examiner—David Mis
Attorney, Agent, or Firm—W. T. Udseth

[57] ABSTRACT

An oscillator in which a selected portion of selected oscillatory cycles can be synchronized with a corresponding selected feature occuring in an externally supplied signal using logic gates with feedback thereabout and an input capacitance.

21 Claims, 2 Drawing Sheets

CONTROLLED OSCILLATOR

BACKGROUND OF THE INVENTION

The present invention relates to logic gate oscillators and, more particularly, to monolithic integrated circuit logic gate oscillators in which selected output signal portions can be directed to occur at the oscillator output in synchronizm with an input signal feature.

Various computer system organization schemes have been used in efforts to enhance one or more aspects of the system. One such organization used to enhance the operational rapidity of such a system is based on having a dual port random access memory with one port thereof connected to the central processing unit and the other port connected to a peripheral or a buss connecting several peripherals or the like. Such an arrangement for providing direct access to the memory for both the central processing unit and the peripheral can increase operational rapidity while reducing the supervisory activities of the central processing unit.

At certain times during operation, the central processing unit will have a need to determine the status of the contents of the dual port memory. This should be done at a time when the contents of that memory are not in the process change as otherwise the central processing unit may reach a determination of contents status which is in error because some changes will have been completed and some won't at the time of the determination.

As a result, provision is often made in the system for a "flag" indicator which the central processing unit can check against, this flag indicator providing an indication of whether the dual port memory is in the process of either having its contents altered or having its contents retrieved.

One arrangement for operating the flag indicator is to have it receive the output signal of an oscillator which alternates between a pair of logic states one of which will place the flag indicator in an "enable" state and the other of which will place the flag indicator in an "inhibit" state. However, the peripheral unit or units connected to one port of the dual port random access memory and the central processing unit connected to the other port are likely to have considerably different clock frequencies providing the time bases for the operation of these devices. Thus, there must be an arrangement provided for the oscillator to have one logic state or the other in selected cycles of its output signal synchronized with these clock signals.

As a result, there is a need for an oscillator which can have a selected portion of selected cycles in its output signal waveform provided at its output in synchronizm with selected features occurring in the clock signals provided by both the central processing unit and the peripheral or peripherals. Further, such an oscillator must be operable in a monolithic integrated circuit to be suitable for use in such a computer system.

SUMMARY OF THE INVENTION

The present invention provides an oscillator system in which a selected portion of selected ones of its output signal oscillatory cycles can be synchronized with a corresponding selected feature occurring in an externally supplied signal, the system having a non-inverting means connected in series with an inverting means with a feedback connection from the output of the inverting means to the input of the non-inverting means. There is a further feedback capacitance provided from the output of the non-inverting means to its input. In addition, there is a capacitance from this non-inverting means input to a reference voltage to keep the voltages occurring during operation at a level which will not lead to reverse biasing any semiconductor pn junctions in a monolithic integrated circuit. A charging means connected to the non-inverting means allows the circuit to be set at an initial condition in synchronizm with an extracted feature from the signal at the circuit input. In addition, this synchronizing arrangement can provide for interrupting the feedback connection temporarily and for immediately setting the output at a desired logic state. Such synchronizing can be accomplished for more than one input signal each provided at different oscillator system inputs.

DETAILED DESCRIPTION OF THE PREFERRED EMBODIMENTS

Figure 1:
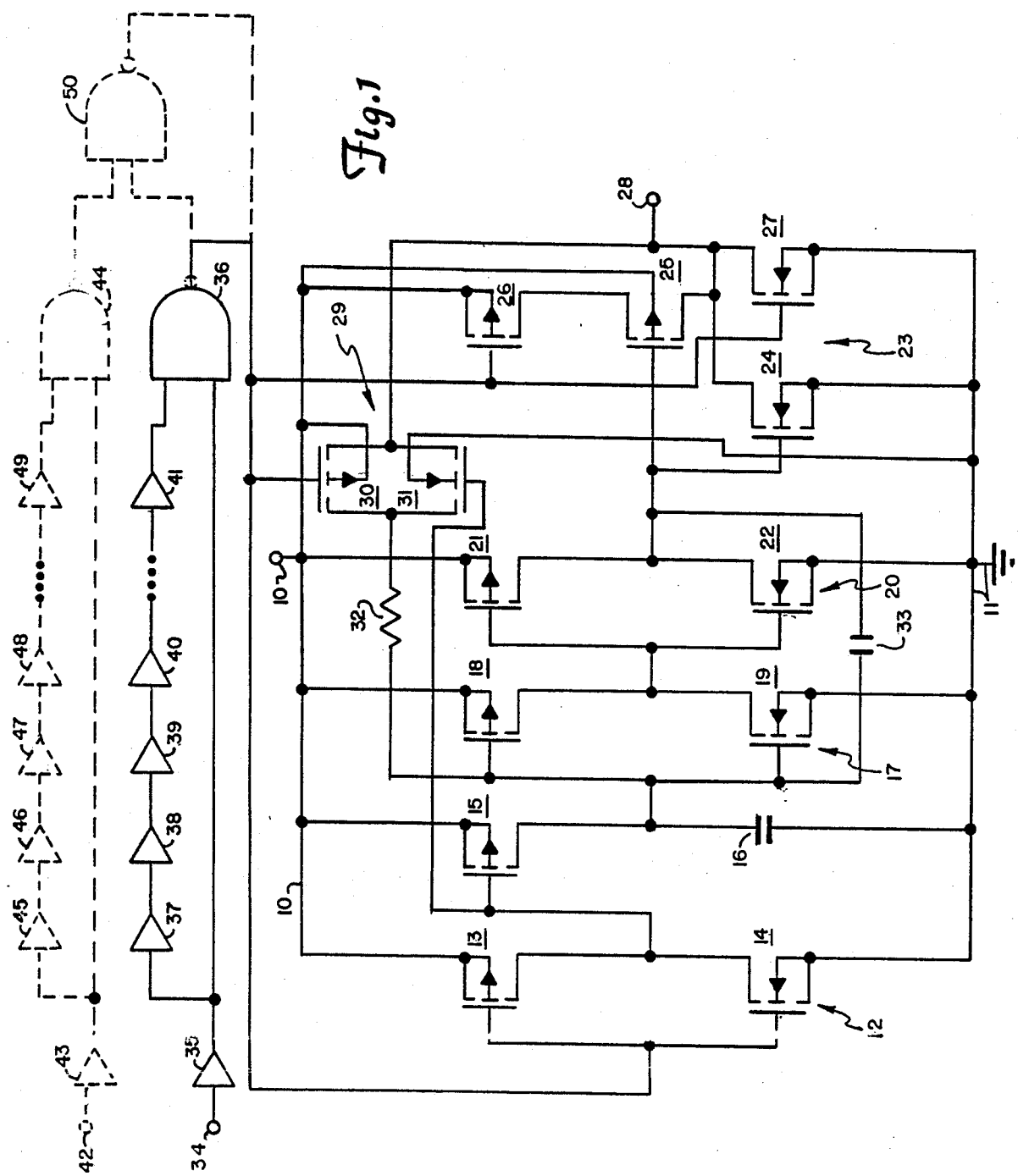
FIG. 1 shows a combined logic schematic and circuit schematic diagram of the present invention.

FIG. 1 shows a mixed logic gate and circuit schematic diagram of the present invention. The circuit component symbols shown are to represent complementary metal-oxide-semiconductor (CMOS) field-effect transistor circuitry as the basis of implementing a series of logic inverters and gates, and other associated logic function components. The logic gates shown in logic symbols can also be implemented in monolithic integrated circuits using such CMOS circuitry in well-know manners. On the other hand, alternative circuit technology could be used to provide the various logic and circuit function components.

In any event, the following description will be based primarily on CMOS field-effect transistor circuitry formed in a monolithic integrated circuit using an n-type conductivity well structural arrangement formed in a p-type conductivity silicon substrate. Each enhancement mode, n-channel insulated gate field-effect transistor (IGFET), e.g. a silicon gate metal-oxide-semiconductor field-effect transistor (MOSFET), is formed as a switching device directly in the substrate. Each enhancement mode, p-channel IGFET, e.g. a silicon gate MOSFET, is formed as a switching device in an n-type conductivity region, the well or tub, which is earlier formed in the p-type conductivity type substrate.

In such an arrangement, each substrate connection for each n-channel MOSFET is made to the p-type conductivity substrate and this substrate is typically connected to the most negative supply voltage in the circuit, usually the ground reference voltage. Each of the p-channel MOSFET connections is made to the n-type conductivity well or tub in which it is formed, these wells in turn each typically being electrically connected to the most positive supply of voltage in the circuit. These substrate connections are shown in FIG. 1.

The n-channel MOSFET's in the circuit typically have a common channel length so that they perform similarly to one another over fabrication process and operating temperature variations, and so typically do the p-channel MOSFET's. After fabrication, these n-channel and p-channel MOSFET's will all have approximately the same effective channel length, even though they are designed with different channel lengths initially, the difference compensating for somewhat different results in the fabrication process for the two kinds of transistors. Thus, differences in the desired "on" condition resistance for these transistors, determined by channel length-to-width ratios, will be provided through selecting different channel widths for different transistors. Alternatively, a series combination of the same kinds of transistors can be provided to achieve, in effect, a longer channel length.

Also, steps taken in the fabrication process to set the value of the threshold voltage for both the n-channel and p-channel MOSFET's results in both kinds of transistors having a zero source-substrate voltage difference threshold voltage of approximately the same magnitude, but of the opposite sign as a nature of these two kinds of transistors requires. The zero source-substrate voltage difference threshold voltage value for the n-channel MOSFET's in the description here is approximately 0.8 V and for the p-channel transistor is approximately −0.8 V. Variations of the threshold voltage due to fabrication process variations lead to similar changes in value and in a common direction for both n-channel and p-channel MOSFET's. However, changes in threshold voltage due to temperature affect the magnitude only of the threshold voltage of each kind of transistor.

The circuitry shown in FIG. 1 operates between a positive voltage supply terminal, 10, and a ground reference voltage supply terminal, 11. The positive supply voltage is typically ___ V. The logic gates shown in FIG. 1 will each also be connected between voltage terminals 10 and 11, although this is not shown.

The logic gates shown by logic gate symbols in FIG. 1, both the solid line depicted logic gate symbols and the dashed line depicted logic gate symbols, form edge detectors used in selecting and extracting the features of the input signals with which oscillator output signal synchronization is to be provided. These arrangements represented by logic gate symbols in FIG. 1 will be described following the description of the oscillator circuitry shown in FIG. 1 in circuit component symbols.

The logic gates represented by circuit symbols in FIG. 1 begin with an inverter, 12, formed by a p-channel MOSFET, 13, and an n-channel MOSFET, 14, through the connection together of the gates of each to form an inverter input and the connection together of the drains of each to form an inverter output. The source of transistor 13 is connected to positive voltage supply terminal 10, and the source of transistor 14 is connected to ground reference terminal 11.

The output of inverter 12 is connected to a charging device, 15, formed by a p-channel MOSFET also having its source connected to positive supply voltage terminal 10, and its gate connected to the output of inverter 12. The drain of charging device 15 is connected to a capacitance, 16, the other side of which is connected to ground reference terminal 11. The drain of transistor 15 is also connected to the input of a further inverter, 17. This inverter has its input formed by the joined gates, and its output formed by the joined drains, of a p-channel MOSFET, 18, and an n-channel MOSFET, 19. The source of transistor 18 is connected to positive supply voltage 10 and the source of transistor 19 is connected to ground reference terminal 11.

The output of inverter 17 is connected to a further inverter, 20, at the joined gates of two further transistors forming the input of inverter 20. These transistors are a p-channel MOSFET, 21, and an n-channel MOSFET, 22, the drains of each being connected together to form the output of inverter 20.

The output of inverter 20 is connected to a first input of a NOR gate, 23, formed by a pair of p-channel MOSFET transistors and a pair of n-channel MOSFET transistors such that this gate has a second input. The output of inverter 20 is connected to the gate of an n-channel MOSFET, 24, and the gate of a p-channel MOSFET, 25. The other input of NOR gate 23 is at the joined gates of a p-channel MOSFET, 26, and an n-channel MOSFET, 27. This second input is connected to an output of the edge detectors arrangement.

The drains of n-channel MOSFET's 24 and 27 are connected together, and to the oscillator system output, 28, as well as to the source of p-channel MOSFET 25. The sources of n-channel MOSFET's 24 and 27 are each connected to ground reference terminal 11. The drain of p-channel MOSFET 25 is connected to the source of p-channel MOSFET 26, the latter having its drain connected to positive supply voltage terminal 10.

There is a feedback arrangement from oscillator system output 28 to the input of inverter 17 beginning with the transmission gate, 29, connected to output 28. Transmission gate 29 comprises a p-channel MOSFET, 30, and an n-channel MOSFET, 31, having the drains of each connected to the sources of the other. The gate of transistor 30 is connected to an output of the edge detectors arrangement, and the gate of transistor 31 is connected to the output of inverter 12. Transmission gate 29 is also connected to a resistor, 32, in series therewith which in turn is connected to the input of inverter 17.

Finally, there is a further feedback connection in the circuit of FIG. 1. This is made by a further capacitance, 33, having one side thereof connected to the output of inverter 20. The other side of capacitance 33 is connected to the input of inverter 17.

In describing the operation of the oscillator circuitry shown by the circuit symbol components in FIG. 1, assume first that there is a "0" logic state (with a voltage value of about zero volts) maintained at the output of the edge detectors arrangement so that these detectors will not have any further effect on the operation of the oscillator circuitry in this oscillator circuit description. Such a lack of further effect on the oscillator circuitry follows since there will result in a "1" logic state at the output of inverter 12 (with a voltage value of approximately that of the voltage provided on positive supply voltage terminal 10) which will cause charging device MOSFET 15 to be in the "off" condition.

Also, the "0" logic state at the outputs of the edge detectors arrangement, and the resulting "1" logic state at the output of inverter 12, will together cause transmission gate 29 to be in the "closed" condition so that resistance 32 is connected through the relatively low impedance of the transmission gate to oscillator system output 28. Finally, the "0" logic state at the output of the edge detectors arrangement will additionally lead to the corresponding input of NOR gate 23 ceding control of the gate to the logic states appearing at the other input thereof. This follows since a "0" logic state at the gates of transistors 26 and 27 will cause transistor 26 to be in the "on" condition and transistor 27 to be in the "off" condition so that transistors 24 and 25 will control the logic state occurring on output 28.

In these circumstances, assume that the input of inverter 17 is initially in the "1" logic state so that capacitor 16 is charged to approximately the voltage provided on positive supply voltage terminal 10. The output of inverter 17 will be in the "0" logic state resulting in the output of inverter 20 being in the "1" logic state. As a result, there will be no charge on capacitor 33 since the input of inverter 17 and the output of inverter 20 are both in the "1" logic state, and output 28 will be in the "0" logic state.

Such a situation will lead to capacitance 16 discharging through resistance 32 and transmission gate 29 to output 28 which will be at approximtely zero volts in the "0" logic state. Such discharging will continue until the voltage across capacitance 16 drops below the switching point of inverter 17. The switching point of inverter 17 will typically be chosen to be half the voltage value appearing on terminal 10 through choosing the width-to-length ratio of p-channel transistor 18 sufficiently greater than that of n-channel transistor 19 to balance the higher channel mobility of transistor 19. This need not be so in that the circuit will operate with a wide range of switching points for inverter 17.

Assuming the switching point of inverter 17 is at a value equal to half the voltage provided on positive supply terminal 10, the voltage on capacitance 16 will fall through the discharging thereof to that value, and so cause inverter 17 to switch to the opposite logic state at its output which is the "1" logic state. The output of inverter 20 will then be switched to the "0" logic state resulting in the output of NOR gate 23 being switched to the "1" logic state.

Since the voltage on capacitance 16 decreases to approximately half the voltage on terminal 10, the voltage on capacitance 33 must correspondingly increase through being charged by the output of inverter 20 to approximately half the voltage on terminal 10 during such a discharging of capacitance 16. Thus, upon the switching of the output of inverter 20 from being in the "1" logic state to being in the "0" logic state, the voltage at the input of inverter 17 would become negative by an amount equal to the voltage on capacitance 33 at the time of switching, or about half the voltage on supply terminal 10 were capacitance 16 not present. However, with capacitance 16 present and with a capacitance value about that of capacitance 33, the positive voltage on it at the input to inverter 17 with respect to ground in effect cancels the negative voltage on capacitance 33 at the input of inverter 17 with respect to ground at the time of the switching of inverter 17 forming its output from the "0" logic state to the "1" logic state.

Thus, immediately after this switching of inverter 17 and the immediately subsequent switchings of inverter 20 and NOR gate 23, the input of inverter 17 is at about zero volts with the system output 28 in the "1" logic state or approximately at the voltage provided on terminal 10. Capacitance 16 immediately begins to charge through resistance 32 and continues to do so until the switching point of inverter 17 is exceeded, this point again being approximately half the voltage appearing on supply voltage 10. Concurrently, capacitance 33 also charges up to this switching point voltage of inverter 17.

After this exceeding switching point of inverter 17, the output of inverter 17 is forced to return from the "1" logic state to the "0" logic state. As a result, the output of inverter 20 is switched to the "1" logic state, and the output of NOR gate 23 is switched to the "0" logic state. This switching of the output of inverter 20 to the "1" logic state would result in the voltage across capacitance 33, which is approximately half that voltage provided at supply terminal 10, being added to the voltage at the output of inverter 20 were capacitance 16 not present. The result would be that the voltage at the input of inverter 17 would exceed the voltage provided at terminal 10 by approximately half that voltage which excess would be supplied by the voltage across capacitance 33 at the time of switching.

Such a situation, with the absence of capacitance 16, would risk very significantly degrading the operation of the monolithic integrated circuit in which this oscillator circuit is formed. Such an excess positive voltage on the drain of transistor 15 would result in the semiconductor pn junction between the drain and n-type conductivity well of transistor 15 becoming forward biased. Such a result could disrupt the operation of other p-channel transistors provided in the same n-type conductivity well. However, again the charge present on capacitance 16 will in effect cancel the charge present on capacitance 33 so that the voltage at the input to inverter 17 will not be much different than the voltage provided at terminal 10.

The oscillatory signal action just described will continue in the oscillator circuit shown in FIG. 1 in the absence of any circuit switching changes or other electrical condition changes being imposed upon this oscillator circuit. As indicated above, for purposes of assuring that a portion of the oscillator output signal waveform takes a selected value, i.e. is in a particular oscillator output logic state, upon the occurrence of a selected feature in a signal of another device, the remaining system components in the diagram of FIG. 1 act on the above-described oscillator circuit upon the occurrence of such a signal feature. First, the feature of the signal from an external device upon which the oscillator output is to be correspondingly synchronized, typically a clock signal, must be chosen. In FIG. 1, the choice is that the feature will be a falling logic state switching transition. The determination of the occurrence of such a feature in an external signal is made by the edge detector shown in FIG. 1 in solid lines.

The external signal, assumed to be a clock signal, which is to be synchronized to a selected portion of selected oscillator output signal cycles is applied to an oscillator system synchronizing input, 34. Oscillator input 34 is connected to the input of a logic inverter, 35. The output of inverter 35 is connected to the input of an AND gate, 36, and to a further string of logic inverters, 37, 38, 39, 40, and possible further ones desired indicated by the series of dots before reaching a final logic inverter, 41. The string of inverters provides a delay which is approximately equal to the sum of the switching times of each of the inverters in the string. The delay time chosen will affect the width of the pulse provided at the output of the edge detectors arrangement, and may be chosen fairly arbitrarily by the number of inverters used although an odd number of inverters must be used.

The signal applied to input 34, typically an independent clock signal used in an external device, alternates between pairs of logic states depending on the conditions in that external device. If the logic state of the external signal has been a "0" logic state most recently, there will be a "1" logic state at the output of inverter 35 and a "0" logic state at the output of inverter 41 assuming that the logic changes from the output of inverter 35 have been completed through the string of inverters to the output of inverter 41. As a result of these opposite logic states at the outputs of inverters 35 and 41, there will be a "0" logic state at the output of AND gate 36.

Upon a transition in the signal at input 34 from the "0" logic state to the "1" logic state, there will be a transition from the "1" logic state to the "0" logic state at the output of inverter 35 and so at the input of AND gate 36 connected thereto. However, for the duration of the time it takes for this logic state change at the output of inverter 35 to complete corresponding state changes in the inverters in the string thereof through to the output of inverter 41, there will continue to be a "0" logic state at the output of inverter 41. Thus, the output of AND gate 36 will remain in a "0" logic state.

Upon the completion of the sequence of logic state changes through the inverter string, the output of inverter 41 will go to the "1" logic state. This will leave a "1" logic state on one input of AND gate 36 and a "0" logic state on the other input so that the output of AND gate 36 will remain in a "0" logic state.

If, on the other hand, the signal at input 34 has been in the "1" logic state recently, the output of inverter 35 will be in the "0" logic state so that the input of AND gate 36 to which it is connected is in the "0" logic state. The output of the last inverter in the string of inverters, inverter 41, will be in the "1" logic state if all logic state changes have been completed through this string of inverters. As a result, AND gate 36 will again have its output in the "0" logic state.

A subsequent change in logic levels in the signal at input 34 to provide a "0" logic state thereon will lead to there being a "1" logic state at the output of inverter 35. This logic state is provided to the input of AND gate 36 to which it is connected, but for the time duration required for the corresponding logic state changes to be completed through the inverter string will continue to leave a "1" logic state at the output of inverter 41. As a result, the output of AND gate 36 will switch to the "1" logic state and remain there until completion of the corresponding logic state changes through the string of inverters leads to there being a "0" logic state at the output of inverter 41. At that time, the output of AND gate 36 will go to the "0" logic state. Thus, there is a pulse provided by this edge detector for each switching in the signal applied to input 34 where the logic states change from a "1" logic state to a "0" logic state.

Thus, the detector shown in solid lines in FIG. 1 can be termed a falling edge detector because of the output pulse it produces upon the occurrence of a switch from a "1" logic state to a "0" logic state in the signal applied to input 34. In other words, this falling edge detector extracts a particular logic state transition feature from the signal applied to input 34 and provides a pulse corresponding thereto which, as will be described in the following, synchronizes a portion of the output waveform at output 28 of the oscillator in a selected cycle to such a falling edge switching transition. That is, the selected portion of selected oscillatory cycles provided in the output signal waveform at oscillator output 28 will be provided correspondingly with each falling edge switching transition in the signal applied to input 34, i.e. synchronized with this falling edge switching transition.

This comes about because the pulse provided at the output of AND gate 36 is applied to the input of inverter 12. This causes the output of inverter 12 to switch to the "0" logic state to result in the gate of charging device transistor 15 being placed at nearly the ground reference voltage to thereby switch transistor 15 into the "on" condition. In these circumstances, capacitance 16 will be charged by the current flowing through transistor 15 supplied from the voltage source providing the positive supply voltage at terminal 10. Capacitance 16 will charge very rapidly because the only significant limit on the current flow therethrough is the "on" resistance of transistor 15 which will be relatively small. In effect, the charging of capacitance 16 will place the input of inverter 17 in a "1" logic state. This, if held sufficient time, will cause oscillator output 28 to be in a "0" logic state.

Two further switching actions are also initiated by "1" logic state pulses appearing at the output of AND gate 36. The first of these switches transistor 26 into the "off" condition and transistor 27 into the "on" condition to immediately force oscillator output 28 to be in the "0" logic condition. Thus, this switching of NOR gate 23 assures that the output of oscillator 28 is placed in the desired logic state without any further delays because of any propagation delays from the input of inverter 12 through the remaining circuit components shown in FIG. 1 to NOR gate 23 which would otherwise have to elapse before the pulse at the input of inverter 12 would affect the logic state at oscillator output 28.

Further, the "1" logic state pulse at the output of AND gate 36 places transmission gate 29 in the "open" condition to effectively disconnect resistance 32 from oscillator output 28. This disconnection prevents any significant current from flowing through resistance 32 for sinking at oscillator output 28, current flows which can be quite significant for relatively long RC time constants involving resistance 32 and the capacitances 16 and 17 in FIG. 1, such time constants being necessary in some applications.

Figure 2:
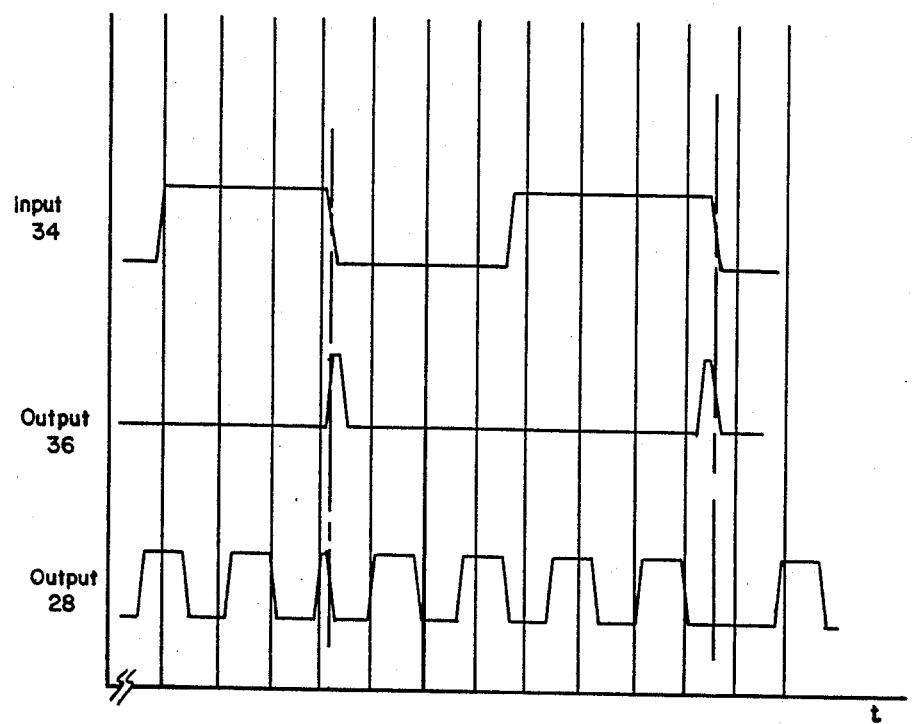
FIG. 2 shows a series of waveforms representing signals generated by the present invention.

FIG. 2 shows selected waveforms from the system of FIG. 1 corresponding to the description just given. The topmost waveform is an assumed clock signal from an external device applied to input 34. As can be seen in the second waveform down, the output of AND gate 36 is such as to provide a short "1" logic state pulse therein for every switching transition from a "1" logic state to a "0" logic state, i.e. a falling edge, in the signal applied to input 34.

The waveform of the signal at oscillator system output 28, if there is a "1" logic state at this output at the time a falling edge occurs in the signal of input 34, immediately switches to a "0" logic state upon a pulse being provided at the output of AND gate 36 in response to the falling edge at input 34. Thus, output 28 has the signal thereon immediately switched from this "1" logic state to a "0" logic state which is the low voltage value portion of its waveform provided for each falling edge in the signal at input 34. This situation is shown in the first alternating short and long dashed line on the left in FIG. 2. Though a "0" logic state, or low voltage value state, has been chosen to be synchronized with a falling edge in the signal on input 34, the system could have easily been arranged to synchronize with a "1" logic state, i.e. a high voltage value state.

If, on the other hand, oscillator output 28 has the signal thereon already in a "0" logic state upon the occurrence of a falling edge in the signal at input 34, that "0" logic state will be extended in time. This is shown along the second alternating long and short dashed line in FIG. 2 on the right.

The description so far treats the situation with a single input signal of an external device from which features are to be extracted against which the selected portion of selected cycles of the oscillator system output waveform are to be synchronized. A further external device signal input, 42, is shown in dashed lines in FIG. 1. Connected to this input is an edge detector which for simplicity is shown to be identical with that one in solid lines. However, either of these edge detectors could be set to select a rising switching transition edge (simply by eliminating the first inverter having its input connected to the corresponding one of system inputs 34 and 42) or one could select a rising edge and one could select a falling edge. Further, other features differing considerably from mere edge detection could be extracted in the logic arrangement connected between either of inputs 34 and 42 and the input to inverter 12 as the features to be used in synchronizing selected portions of selected cycles in the oscillator output signal provided on oscillator output 28.

Again, connected to input 42 there is shown in FIG. 2 the input of a further inverter, 43, having its output connected to a NAND gate 44. The output of inverter 43 is also connected to a string of inverters connected to another input of NAND gate 44, these inverters being designated 45, 46, 47, 48 and, lastly, 49, with again the possibility of there being further inverters as indicated by the dots between inverters 48 and 49.

In this situation where there are two input signals with one applied to each of inputs 34 and 42 from each of which a feature is to be extracted for synchronizing purposes with selected portions of selected cycles of the oscillator output signal waveform at oscillator output 28, what has been AND gate 36 in the earlier description will now be referred to as NAND gate 36 as indicated by the dashed line circle at the output thereof. Also, the direct connection between the output of former AND gate 36 and the input of inverter 12 will in this situation be considered eliminated and, instead, the output of what is now NAND gate 36 will be connected to the input of a further NAND gate, 50, as is the output of NAND gate 44. The output of NAND gate 50 is then connected directly to the input of inverter 12.

In this configuration, the output of each edge detector, either at the output of NAND gate 36 or at the output of NAND gate 44, will be in the "1" logic state unless a falling edge has been detected in which case they will provide a "0" logic state pulse. NAND gate 50, on the other hand, will have its output always in the "0" logic state unless either of the edge detectors provides a "0" logic state pulse at an input thereof which will then cause the output of NAND gate 50 to provide a "1" logic state pulse. Thus, "1" logic gate pulses from the output of NAND gate 50 will again be applied to the input of inverter 12 to indicate that a falling edge switching transition has been extracted by one of the edge detectors connected to inputs 34 or 42 to thereby require that there be a "0" logic state present at output 28 of the oscillator system. As a result, the waveform provided at output 28 will always have a "0" state provided therein upon there being a falling edge switching transition in either of the signals applied to inputs 34 and 42.

Figure 3:
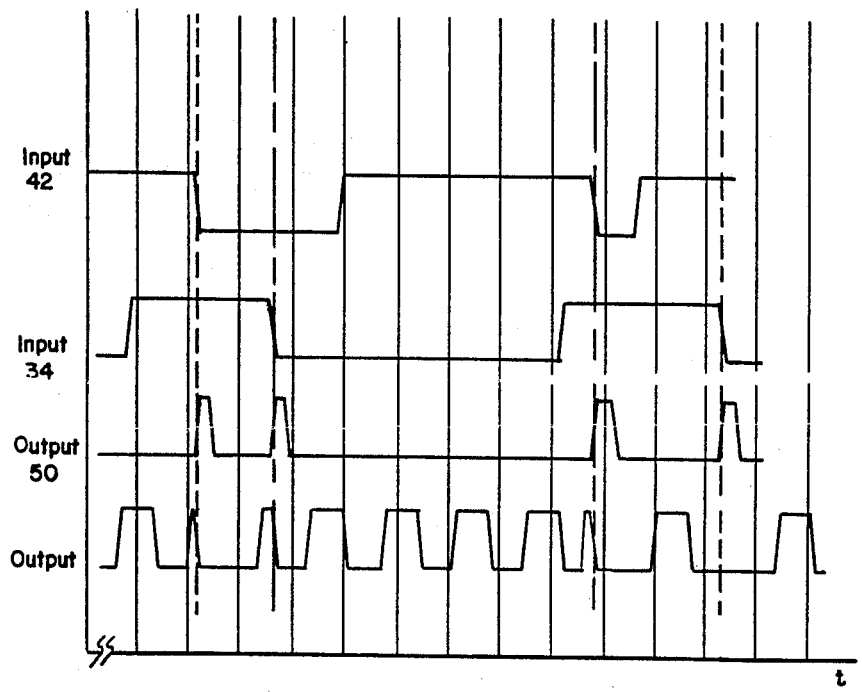
FIG. 3 shows an alternative series of waveforms of signals generated by the present invention.

The result is shown in FIG. 3 where again signal waveforms from selected nodes in the system of FIG. 1 are shown. Again, one can see that the alternating long and short dashed lines corresponding to the falling edges in the signal applied to input 34 correspond with the result of there being an immediate switching of the signal on output 28 into the "0" logic state. Similarly, falling edges in the signal applied at input 42 are shown by short dashed lines to also correspond to the switching of output 28 into the "0" logic state on the left, or to continuing for a longer period in the "0" logic state if the signal on oscillator output 28 had already been in that state. As can be seen, either of the signals at inputs 34 and 42 can cause the "0" logic state, or low voltage value state, to appear in the signal at output 28 of the oscillator system.

Although the present invention has been described with reference to preferred embodiments, workers skilled in the art will recognize that changes may be made in form and detail without departing from the spirit and scope of the invention.

What is claimed is:

1. An oscillator which can have a selected portion of selected ones of those oscillatory cycles occurring in its output signals provided at an output thereof synchronized correspondingly with selected features of an external signal provided at a first synchronizing signal input, said oscillator comprising:

a non-inverting means having a first input and having a first output, said non-inverting means being capable of switching between pairs of logic states at each of said first input and said first output thereof such that there are identical logic states substantially present on each;

an inverting means having a first input and having a first output which is electrically connected to said oscillator output, said inverting means being capable of switching between pairs of logic states at each of said first input and said first output thereof such that opposite logic states are substantially present on each, said inverting means first input being electrically connected to said non-inverting means first output;

a first feedback means having a first input and having a first output, said first feedback means being capable of providing a signal at said first output thereof which is a representation of a signal provided at said first input thereof, said first feedback means first input being electrically connected to said inverting means first output and said first feedback means first output being electrically connected to said non-inverting means first input;

a first capacitive means having first and second terminating regions between which electrical capacitance is exhibited, said first capacitive means first terminating region being electrically connected to said non-inverting means first output and said first capacitive means second terminating region being electrically connected to said non-inverting means first input; and a second capacitive means having first and second terminating regions between which electrical capacitance is exhibited, said second capacitive means first terminating region being electrically connected to said non-inverting means first input and said second capacitive means second terminating region being electrically connected to a first terminal means adapted for connection to a first source of voltage.

2. The apparatus of claim 1 wherein said first non-inverting means comprises a plurality of logic devices, even in number, with each having a first input and a first output and each being capable of switching between pairs of logic states at each of said first input and said first output such that there is an opposite logic state present on each, each of said logic devices having its first input electrically connected to a first output of another said logic device except for a first input of a first logic device which serves as said non-inverting means first input, and except for a first output of a last logic device which serves as said non-inverting means first output.

3. The apparatus of claim 1 further comprising a charging means having an input and an output, said charging means capable of providing a voltage of a selected value at said output thereof in response to a signal provided at said input thereof, said charging means output being electrically connected to said non-inverting means first input; and further comprising a synchronization control means having a first input and a first output, said synchronization control means being capable of providing a selected first synchronizing signal at said first output thereof in response to a selected feature being present in a signal provided at said first input thereof, said synchronization control means first output being electrically connected to said charging means input, and said synchronization control means first input being electrically connected to said oscillator first synchronizing signal input.

4. The apparatus of claim 1 wherein said first feedback means comprises an electrical resistance means.

5. The apparatus of claim 1 wherein said oscillator comprises both n-channel and p-channel MOSFET's in a monolithic integrated circuit.

6. The apparatus of claim 3 wherein said inverting means has a second input, said invertering means second input being electrically connected to an output of said synchronization control means.

7. The apparatus of claim 3 wherein said charging means comprises a charging device having first and second terminating regions and having a control region therein by which said charging device is capable of being directed, through electrical energization thereof, to effectively provide a conductive path of a selected conductivity between said charging device first and second terminating regions, said charging device first terminating region being electrically connected to a second terminal means adapted for connection to a second source of voltage, said charging device second terminating region serving as said charging means output, and said charging device control region being electrically connected to said charging means input.

8. The apparatus of claim 3 wherein said synchronization control means comprises a first edge detector electrically connected synchronization control means first input such that selected transitions between logic states in a signal applied at said synchronization control means first input lead to a sense signal appearing at said synchronization control means first output.

9. The apparatus of claim 3 wherein said oscillator has a second synchronizing signal input, and said synchronization control means has a second input serving as said oscillator second synchronizing signal input, said synchronization control means being capable of providing a selected second synchronizing signal at an output thereof in response to a selected feature being present in a signal provided at said second input thereof.

10. The apparatus of claim 4 wherein said first feedback means further comprises a switch means electrically connected in series with said resistance means which together are electrically connected between said first feedback means first input and said first output.

11. The apparatus of claim 6 wherein said inverting means second input is electrically connected to said synchronization control means first output.

12. The apparatus of claim 6 wherein said inverting means second input is electrically connected to a second output of said synchronization control means.

13. The apparatus of claim 7 wherein said charging device is a MOSFET.

14. The apparatus of claim 8 wherein said edge detector detects transitions in a signal applied to said oscillator first synchronizing signal input from a high logic state to a low logic state.

15. The apparatus of claim 8 wherein said edge detector detects transitions between pairs of logic states in just one direction in a signal applied to said oscillator first synchronizing signal input.

16. The apparatus of claim 9 further comprising a second edge detector electrically connected to said synchronization control means second input such that selected transitions between logic states in a signal applied at said synchronization control means second input synchronizing signal lead to a sense signal appearing at an ouput of said synchronization means.

17. The apparatus of claim 9 wherein said second synchronizing signal is provided at said synchronization control means first output.

18. The apparatus of claim 9 wherein said synchronization control means comprises a first edge detector electrically connected synchronization control means first input such that selected transitions between logic states in a signal applied at said synchronization control means first input lead to a sense signal appearing at said synchronization control means first output.

19. The apparatus of claim 10 wherein said switch means is formed by a switching device having first and second terminating regions and a control region therein by which said switching device is capable of being directed, through electrical energization thereof, to effectively provide a conductive path of a selected conductivity between said switching device first and second terminating regions, said switching device control region being electrically connected to an output of said synchronization control means.

20. The apparatus of claim 18 further comprising a second edge detector electrically connected to said synchronization control means second input such that selected transitions between logic states in a signal applied at said synchronization control means second input synchronizing signal lead to a sense signal appearing at an ouput of said synchronization means.

21. The apparatus of claim 20 wherein sense signals caused by signals of either of said synchronization control means first and second inputs appear at said synchronization control means first output.

* * * * *